US 7,228,483 B2

(12) United States Patent
Kuwahara

(10) Patent No.: US 7,228,483 B2
(45) Date of Patent: Jun. 5, 2007

(54) TURBO DECODING DEVICE

(75) Inventor: Yuji Kuwahara, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 515 days.

(21) Appl. No.: 10/862,376

(22) Filed: Jun. 8, 2004

(65) Prior Publication Data

US 2004/0260997 A1 Dec. 23, 2004

(30) Foreign Application Priority Data

Jun. 9, 2003 (JP) ............... P. 2003-164120

(51) Int. Cl.
*H00M 13/00* (2006.01)
(52) U.S. Cl. ............ 714/755; 714/701; 714/786; 714/788; 714/762; 714/794; 714/795; 714/780; 375/341; 375/262
(58) Field of Classification Search ......... 714/786, 714/755, 794–796, 788, 762
See application file for complete search history.

(56) References Cited

U.S. PATENT DOCUMENTS

| 6,292,918 | B1 | 9/2001 | Sindhushanaya et al. |
| 6,339,834 | B1 * | 1/2002 | Crozier et al. ............... 714/701 |
| 6,360,345 | B1 | 3/2002 | Kim et al. |
| 6,697,994 | B2 * | 2/2004 | Ishikawa ................ 714/786 |

OTHER PUBLICATIONS

Dobkin et al. 'Parallel VLSI architecture for MAP turbo decoder,' The 13th IEEE International Symposium on Personal, Indoor and Mobile Radio Communications, Sep. 15-18, 2002; pp. 384-388 vol. 1.*

Peter Jung, et al., "Comprehensive comparison of Turbo-Code decoders," Vehicular Technology Conference, 1995, pp. 624-628, IEEE.

Peter H.-Y, WU, et al., "Implementation of a Low Complexity, Low Power, Integer-Based Turbo Decoder," Global Telecommunications Conference, 2001, pp. 946-951.

Zhongfeng Wang, "Area-Efficient High-Speed Decoding Schemes for Turbo Decoders," IEEE Transactions on Very Large Scale Integration (VLSI) Systems, Dec. 2002, pp. 902-912, vol. 10, No. 6.

"New coding system getting near to Shannon limit: Turbo Codes", Nikkei Electronics, No. 721, pp. 163-177, Jul. 13, 1998.

* cited by examiner

*Primary Examiner*—Guy J. Lamarre
(74) *Attorney, Agent, or Firm*—McDermott Will & Emery LLP

(57) ABSTRACT

To shorten a time required for a decoding process of a turbo codes without an increase in an operating frequency of the decoder by making concurrent operations of two soft-output decoders possible, the present invention provides soft-output decoders (101, 102) for outputting a reliability information likelihood, interleavers (103, 105) for interleaving transmission information to supply to the soft-output decoder, interleaver (104, 106) for interleaving a reliability information likelihood to supply to the soft-output decoder, and deinterleavers (107, 108) for deinterleaving the reliability information likelihood to supply to the soft-output decoder. Since these elements are constructed as two circuits having the same configuration and two soft-output decoders are operated concurrently in an iterative decoding process for a second time et seq. in the iterative decoding process of the turbo codes, a processing time required for the decoding process for the second time et seq. can be reduced by half.

13 Claims, 11 Drawing Sheets

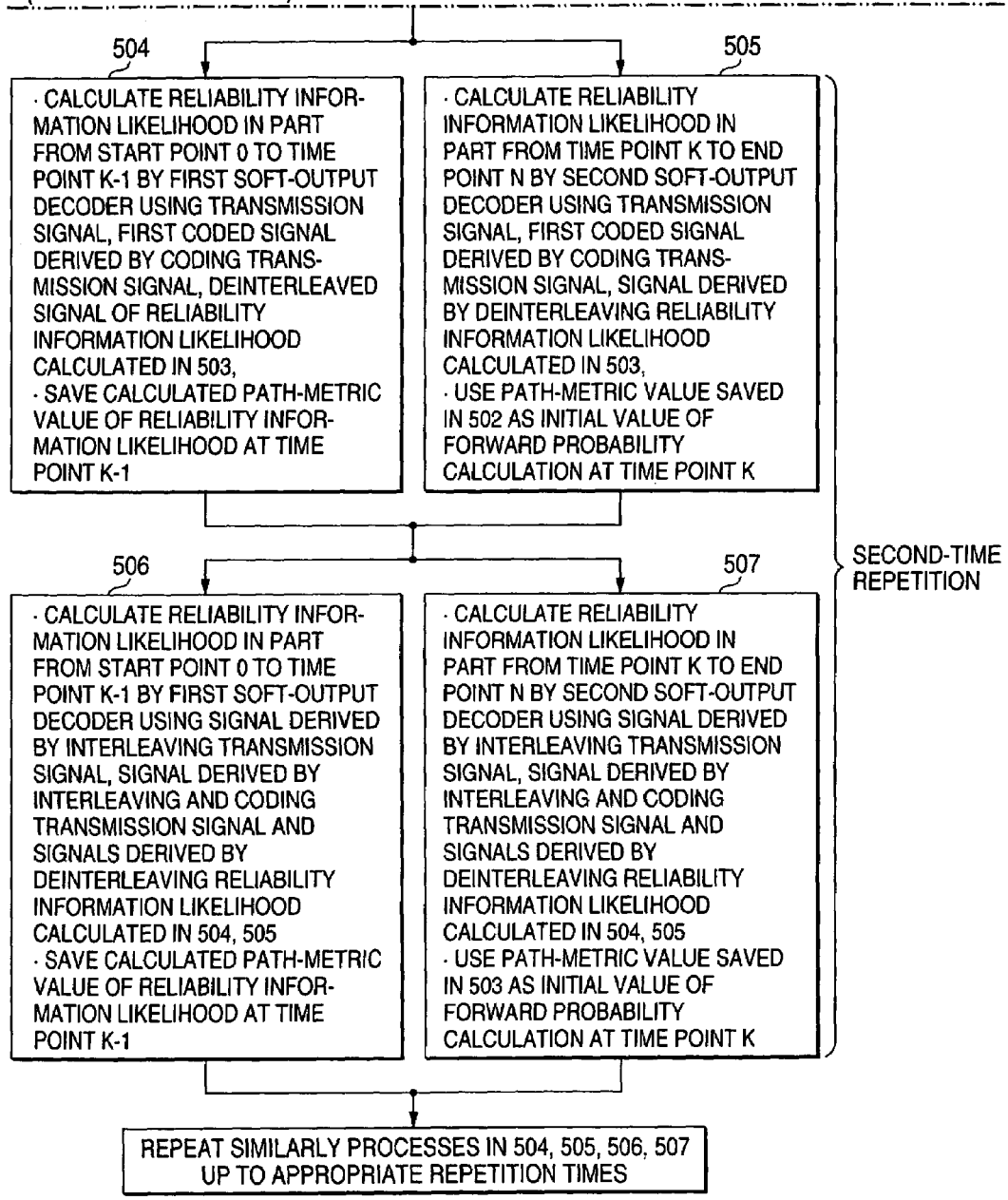

TURBO DECODING DEVICE

BACKGROUND OF THE INVENTION

1. Field of the Invention

The present invention relates to a decoding of a receiving sequence coded by the turbo codes and, more particularly, a turbo decoding device for executing the decoding by means of a soft-input/soft-output decoding.

2. Description of the Related Art

In recent years, the turbo coding system gets into the spotlight as the channel coding system that takes a step closer to the Shannon limit. In the mobile phone which deals with the multimedia and the importance of which is increasing in the data communication, such turbo coding system is employed as the coding system that gives a lower bit error rate.

Various proposals of its implementation in the mobile device, and so on as well as its theoretical study have been made since the turbo codes was proposed. For example, in Patent Literature 1 (JP-A-2001-285079), in order to achieve a miniaturization and a lower power consumption of the LSI used to decode the turbo codes, a decoding of the convolutional codes and a decoding of the turbo codes, which are executed before now by a dedicated decoder respectively, are managed by one LSI.

FIG. 10 is a block diagram showing a configuration of a turbo decoding device in the prior art. In FIG. 10, a reference numeral 1001 is a first soft-output decoder, 1002 is a second soft-output decoder, 1003 is a first interleaver, 1004 is a second interleaver, 1005 is a deinterleaver, and a 1006 is a hard decision unit.

Also, 1007 to 1009 are received turbo codes, 1007 is transmission information, 1008 is a first coded signal derived by coding the transmission information, and 1009 is a second coded signal derived by interleaving and coding the transmission information.

The first interleaver 1003 interleaves the transmission information 1007, the second interleaver 1004 interleaves a reliability information likelihood that the first soft-output decoder 1001 outputs, and the deinterleaver 1005 deinterleaves a reliability information likelihood that the second soft-output decoder 1002 outputs.

Also, the transmission information 1007, the first coded signal 1008, and an output of the deinterleaver 1005 are input into the first soft-output decoder 1001. Also, an output of the first interleaver 1003, an output of the second interleaver 1004, and the second coded signal 1009 are input into the second soft-output decoder 1002.

In the turbo decoding device constructed in this manner, the first soft-output decoder 1001 and the second soft-output decoder 1002 repeat a decoding process alternately and then the hard decision unit 1006 hard-decides an output of the second soft-output decoder 1002, so that the decoding of the turbo codes is carried out (for example, see Non-Patent Literature 1: K. Yamaguchi, H. Imai, "New coding system getting near to Shannon limit: Turbo Codes", NIKKEI ELECTRONICS, No. 721, pp.163-177, Jul. 13, 1998).

The turbo decoding device in the prior art executed a decoding process by operating two soft-output decoders alternately. Therefore, assume that a processing time that one soft-output decoder needs to calculate totally a likelihood calculation of a length N is M, a processing time of at least 2× M or more is consumed as a time required for the decoding process of transmission information of a length N.

SUMMARY OF THE INVENTION

The present invention has been made in view of such circumstances, and it is an object of the present invention to provide a turbo decoding device capable of shortening a time required for a decoding process of a turbo codes without an increase in an operating frequency of the decoder by making concurrent operations of two soft-output decoders possible.

The first aspect of the present invention provides a turbo decoding device for executing a soft-input/soft-output decoding by using a receiving sequence having transmission information, a first coded signal derived by coding the transmission information, and a second coded signal derived by interleaving and coding the transmission information, which comprises a first soft-output decoder for outputting a first reliability information likelihood; a second soft-output decoder for outputting a second reliability information likelihood; a first interleaver for interleaving the transmission information to supply to the first soft-output decoder; a second interleaver for interleaving the first reliability information likelihood or the second reliability information likelihood to supply to the first soft-output decoder; a first deinterleaver for deinterleaving the first reliability information likelihood or the second reliability information likelihood to supply to the first soft-output decoder; a third interleaver for interleaving the transmission information to supply to the second soft-output decoder; a fourth interleaver for interleaving the first reliability information likelihood or the second reliability information likelihood to supply to the second soft-output decoder; and a second deinterleaver for deinterleaving the first reliability information likelihood or the second reliability information likelihood to supply to the second soft-output decoder.

According to the above configuration, a circuit including the first soft-output decoder, the first interleaver, the second interleaver, and the first deinterleaver and a circuit including the second soft-output decoder, the third interleaver, the fourth interleaver, and the second deinterleaver are constructed as the same configuration circuit. Therefore, if the appropriate iterative decoding process control is carried out, two soft-output decoders can be concurrently operated to share the decoding process equally between them, and also a processing time can be halved.

The second aspect of the present invention provides a turbo decoding device which further comprises a means for saving a path-metric value calculated by the first soft-output decoder at a certain time point when the receiving sequence in which the transmission information of a length N is coded is decoded by an iterative process; and a controlling means for using the path-metric value in a subsequent iterative process as an initial value of a forward probability calculation in the second soft-output decoder.

According to the above configuration, the path-metric value calculated at the time of preceding decoding in the iterative decoding process is saved, and then this value is used as the initial value of a forward probability calculation in the subsequent iterative decoding process. Therefore, when the receiving sequence is divided to share the decoding process equally between them, an improvement in an error correcting capability can be achieved.

The third aspect of the present invention provides a turbo decoding device which further comprises a means for saving an internal state of the third interleaver at any time point in a first-time decoding process when a receiving sequence in which the transmission information of a length N is coded is decoded by an iterative process; and a controlling means for using the internal state in a decoding process for a second time et seq. as initial values of the third interleaver, the fourth interleaver, and the second deinterleaver.

The fourth aspect of the present invention provides a turbo decoding device, in which, during an iterative decoding process for a second time et seq. using the transmission information of a length N, the first coded signal derived by coding the transmission information, and the first reliability information likelihood or the second reliability information likelihood calculated in a preceding iterative decoding process, a decoding process from a start point 0 to a time point K−1 is executed by the first soft-output decoder and a decoding process from a time point K to an end point N is executed by the second soft-output decoder.

The fifth aspect of the present invention provides a turbo decoding device, in which, during the iterative decoding process for a second time et seq. using a signal derived by interleaving the transmission information of a length N, the second coded signal derived by interleaving and coding the transmission information, and the first reliability information likelihood or the second reliability information likelihood, a decoding operation process from an interleave start point 0 to an interleave time point K−1 is executed by the first soft-output decoder and a decoding operation from an interleave time point K to an interleave end point N is executed by the second soft-output decoder.

According to the inventions, in the iterative decoding process for the second-time et seq., two soft-output decoders can be operated to share the decoding process from the start point 0 to the time point K−1 and the decoding process from the time point K to the end point N between them respectively. Therefore, a processing time can be reduced by half without an increase in an operating frequency of the decoder.

The sixth aspect of the present invention provides a turbo decoding device, in which, a soft-input/soft-output decoding of a first receiving sequence having the transmission information of a length N, the first coded signal derived by coding the transmission information, and the second coded signal derived by interleaving and coding the transmission information is executed by the first soft-output decoder, and a soft-input/soft-output decoding of a second receiving sequence having the transmission information of a length M, the first coded signal derived by coding the transmission information, and the second coded signal derived by interleaving and coding the transmission information, which has no mutual dependency on the first receiving sequence, is executed by the second soft-output decoder.

According to the above configuration, since the soft-input/soft-output decoding processes of two receiving sequences can be carried out in parallel by two soft-output decoders, a processing time can be halved when two receiving sequences are decoded.

The seventh aspect of the present invention provides a turbo decoding device, in which, when the reliability information likelihood is calculated by using the transmission information and the first coded signal out of the first receiving sequence in the first soft-output decoder, the reliability information likelihood is calculated by using the signal derived by interleaving the transmission information and the second coded signal out of the second receiving sequence in the second soft-output decoder during.

According to the above configuration, since the first soft-output decoder and the second soft-output decoder use exclusively the receiving sequence, the concurrent access to the memories that hold these receiving sequences can be avoided. As a result, these memories can be constructed by a single-port memory.

The eighth aspect of the present invention provides a turbo decoding device, in which, when lengths of the transmission information are not equal in a first-time iterative decoding process in the first receiving sequence and the second receiving sequence, one soft-output decoder, which ends earlier a calculation of the reliability information likelihood, out of the first soft-output decoder and the second soft-output decoder is brought into a wait state until other soft-output decoder ends the calculation of the reliability information likelihood.

According to the above configuration, even in the situation that lengths of the first receiving sequence and the second receiving sequence are different, the process of the other soft-output decoder can be brought into a wait state after the process of any one soft-output decoder is ended. Therefore, the soft-input/soft-output decoding processes of two receiving sequences can be carried out in parallel by two soft-output decoders. As a result, a decoding processing time can be halved.

Figure 1:
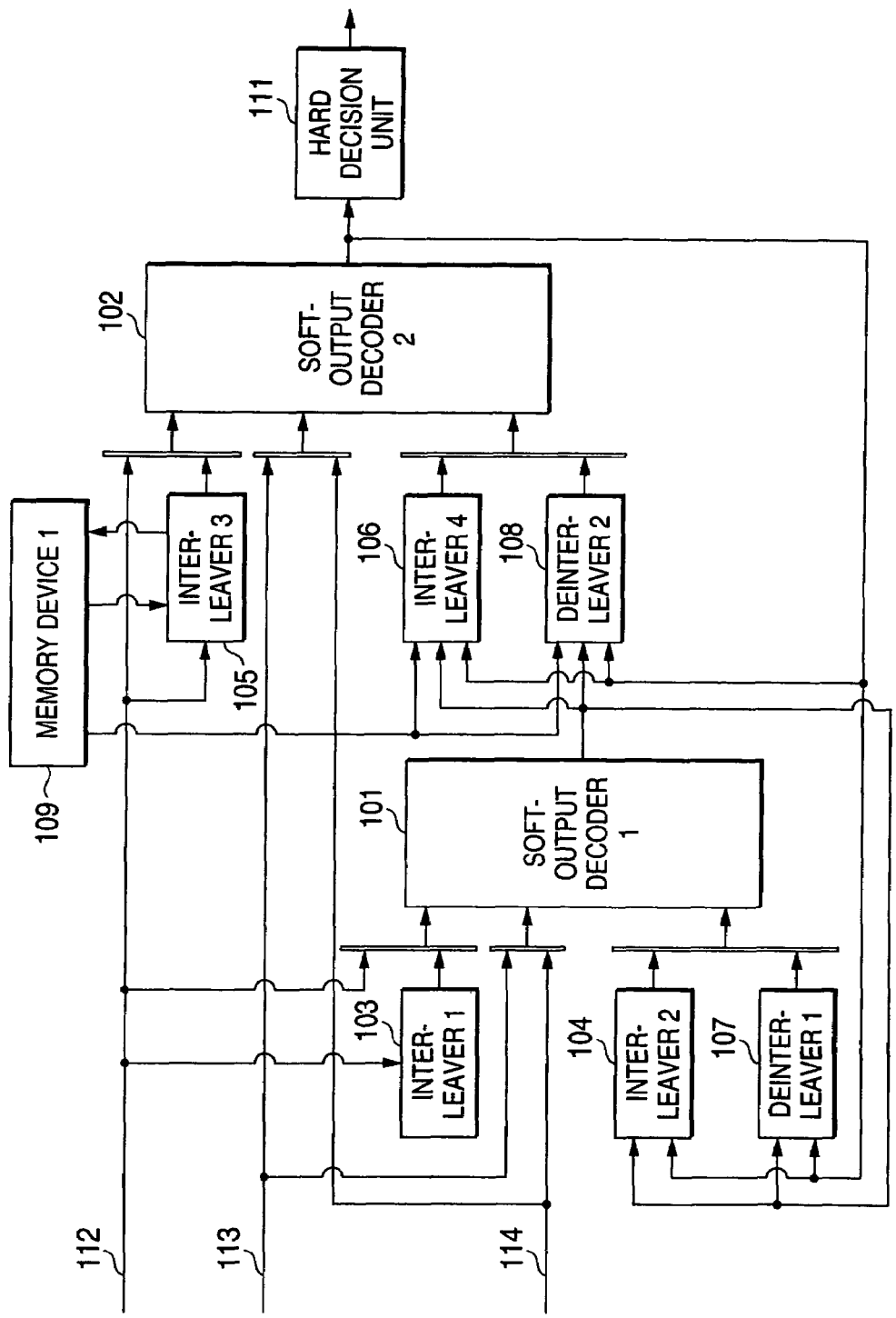
FIG. 1 is a block diagram showing a configuration of a turbo decoding device according to an embodiment 1 of the present invention.

In the drawings, reference numerals refer to as follows: 101, 1001 to a first soft-output decoder; 102, 1002 to a second soft-output decoder; 103, 1003 to first interleaver; 104, 1004 to a second interleaver; 105 to a third interleaver; 106 to a fourth interleaver; 107, 1005 to a first deinterleaver; 108 to a second deinterleaver; 109 to a first memory device; 110 to a second memory device; 111, 615, 1006 to a hard decision unit; 112, 616, 1007 to a transmission information; 113, 617, 1008 to a first coded signal; 114, 618, 1009 to a second coded signal; 619 to a memory control block; 620 to a transmission information memory; 621 to a first coded-signal memory; 622 to a second coded-signal memory; 823 to a main control block; 824 to a wait signal for a first soft-output decoder; and 825 to a wait signal for a second soft-output decoder.

Additionally, 201 to 207 and 501 to 507 denote steps; 301 to 306, 701 to 708, and 901 to 908 denote mode processes; and 909 to 912 denote a waiting process.

DETAILED DESCRIPTION OF THE PREFERRED EMBODIMENTS

Embodiments of the present invention will be explained in detail with reference to the drawings hereinafter.

Embodiment 1

Figure 2:
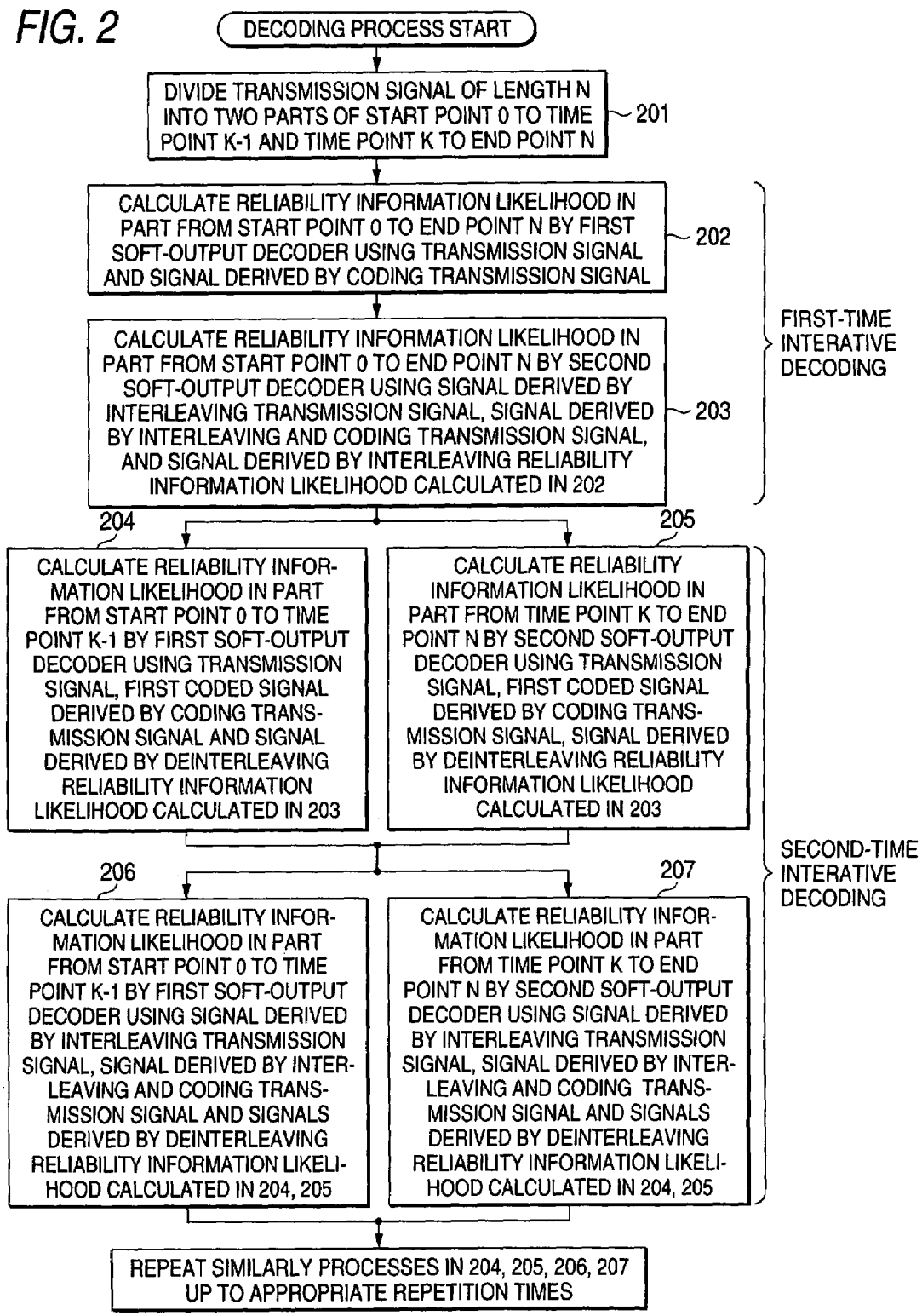
FIG. 2 is a flowchart showing a decoding process of the turbo decoding device according to the embodiment 1 of the present invention.
Figure 3:
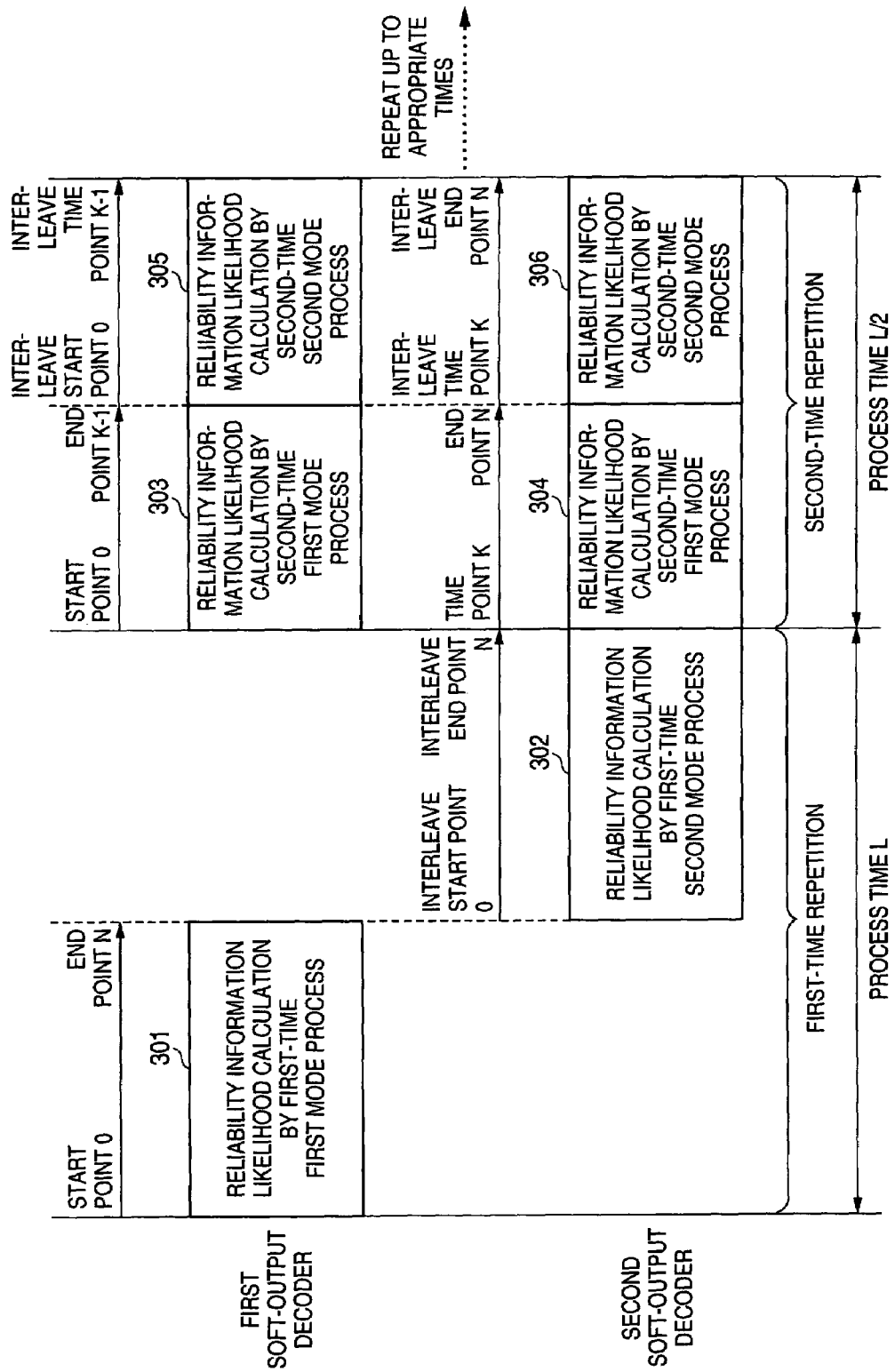
FIG. 3 is a timing chart showing operations of soft-output decoders in the turbo decoding device according to the embodiment 1 of the present invention.

FIG. 1 is a block diagram showing a configuration of a turbo decoding device according to an embodiment 1 of the present invention. FIG. 2 is a flowchart showing a decoding process of the turbo decoding device according to the embodiment 1 of the present invention. FIG. 3 is a timing chart showing operations of first and second soft-output decoders in the turbo decoding device according to the embodiment 1 of the present invention.

In FIG. 1, a reference numeral 101 is a first soft-output decoder, 102 is a second soft-output decoder, 103, 104, 105, and 106 are a first interleaver, a second interleaver, a third interleaver, and a fourth interleaver respectively, 107 and 108 are a first deinterleaver and a second deinterleaver respectively, 109 is a first memory device, and 111 is a hard decision unit.

Also, 112 to 114 are received turbo codes, 112 is transmission information, 113 is a first coded signal derived by coding the transmission information, and 114 is a second coded signal derived by interleaving and coding the transmission information.

The first interleaver 103 and the third interleaver 105 interleave the transmission information 112. Also, the second interleaver 104 and the fourth interleaver 106 interleave a reliability information likelihood being output from the first soft-output decoder 101 or a reliability information likelihood being output from the second soft-output decoder 102. Also, the first deinterleaver 107 and the second deinterleaver 108 deinterleave the reliability information likelihood being output from the first soft-output decoder 101 or the reliability information likelihood being output from the second soft-output decoder 102.

One of the transmission information 112 or an output of the first interleaver 103, one of the first coded signal 113 or the second coded signal 114, and one of an output of the second interleaver 104 or an output of the first deinterleaver 107 are input selectively into the first soft-output decoder 101 respectively.

One of the transmission information 112 or an output of the third interleaver 105, one of the first coded signal 113 or the second coded signal 114, and one of an output of the fourth interleaver 106 or an output of the second deinterleaver 108 are input selectively into the second soft-output decoder 102 respectively.

In this manner, a circuit including the first soft-output decoder 101, the first interleaver 103, the second interleaver 104, and the first deinterleaver 107 and a circuit including the second soft-output decoder 102, the third interleaver 105, the fourth interleaver 106, and the second deinterleaver 108 are constructed as the same configuration circuit respectively.

In the turbo decoding device constructed in this way, as preparations for the iterative decoding process for the second time et seq., in step 201, the transmission information 112 of a length N, the first coded signal 113 and the second coded signal 114 are divided into two parts of information from a start point 0 to a time point K−1 and information from a time point K to an end point N.

First, as a first mode process 301 of the first-time iterative decoding process, in step 202, the transmission information 112 of a length N and the first coded signal 113 are supplied to the first soft-output decoder 101 to calculate a reliability information likelihood.

Then, as a second mode process 302 of the first-time iterative decoding process, in step 203, a signal derived by interleaving the transmission information 112 by virtue of the third interleaver 105 and the second coded signal 114 are supplied to the second soft-output decoder 102, and also a signal derived by interleaving the reliability information likelihood calculated in the first mode process 301 by virtue of the fourth interleaver 106 is supplied to the second soft-output decoder 102 as a priori information likelihood. Thus, the reliability information likelihood of a length N is calculated.

Also, an internal state obtained when the third interleaver 105 calculates an interleaved value at the time point K is saved in the first memory device 109. In this manner, the reliability information likelihood being output from the second soft-output decoder 102 is supplied to the hard decision unit 111 to output the first-time decoded result.

Then, as first mode processes 303/304 of the second-time iterative decoding, in steps 204/205, the transmission information 112 and the first coded signal 113 are supplied to the first soft-output decoder 101 and the second soft-output decoder 102, and a signal derived by deinterleaving the reliability information likelihood being calculated in the first-time second mode process 302 by virtue of the first deinterleaver 107 is supplied to the first soft-output decoder 101, and also a signal derived by deinterleaving the reliability information likelihood by virtue of the second deinterleaver 108 is supplied to the second soft-output decoder 102. Thus, in step 204, the reliability information likelihood of the transmission information 112 of a length N in the part from the start point 0 to the time point K−1 is calculated by the first soft-output decoder 101. At the same time, in step 205, the reliability information likelihood in the part from the time point K to the end point N is calculated by the second soft-output decoder 102.

Then, as second mode processes 305/306 of the second-time iterative decoding, in steps 206/207, the second coded signal 114 and a signal derived by interleaving the transmission information 112 by virtue of the first interleaver 103 are supplied to the first soft-output decoder 101, and the second coded signal 114 and a signal derived by interleaving the transmission information 112 by virtue of the third interleaver 105 are supplied to the second soft-output decoder 102. Also, a signal derived by interleaving the reliability information likelihood calculated in the first mode processes 305/306 of the second-time iterative decoding by virtue of the second interleaver 104 is supplied to the first soft-output decoder 101 as a priori information likelihood, and a signal derived by interleaving the reliability information likelihood by virtue of the fourth interleaver 106 is supplied to the second soft-output decoder 102 as a priori information likelihood. Thus, the part from the start point 0 to the time point K−1 is decoded by the first soft-output decoder 101 in step 206, and simultaneously the part from the time point K to the end point N is decoded by the second soft-output decoder 102 in step 207.

At this time, a value saved in the first memory device 109 in the first-time second mode process 302 is used as initial values of the third interleaver 105 and the fourth interleaver 106. Also, the reliability information likelihoods output from the first soft-output decoder 101 and the second soft-output decoder 102 are supplied to the hard decision unit 111, and thus the second-time decoded result is output.

Subsequently, the decoding process similar to the second-time iterative decoding is executed up to the appropriate repetition times. As explained above, if the above operations are carried out by using the turbo decoding device of the present embodiment, a processing time required for the iterative decoding process for the second time et seq. can be reduced by half.

Embodiment 2

Figure 4:
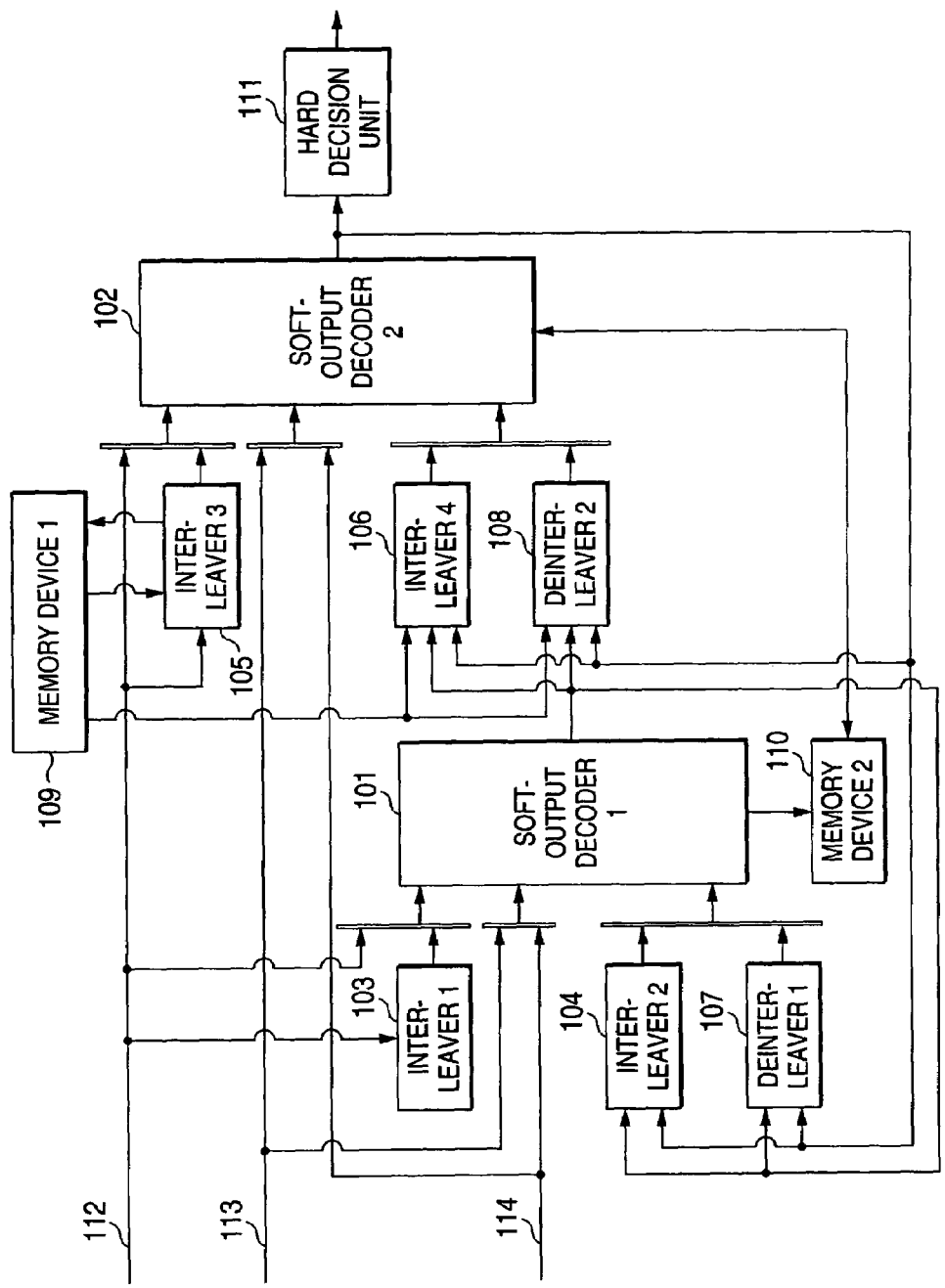
FIG. 4 is a block diagram showing a configuration of a turbo decoding device according to an embodiment 2 of the present invention.
Figure 5:
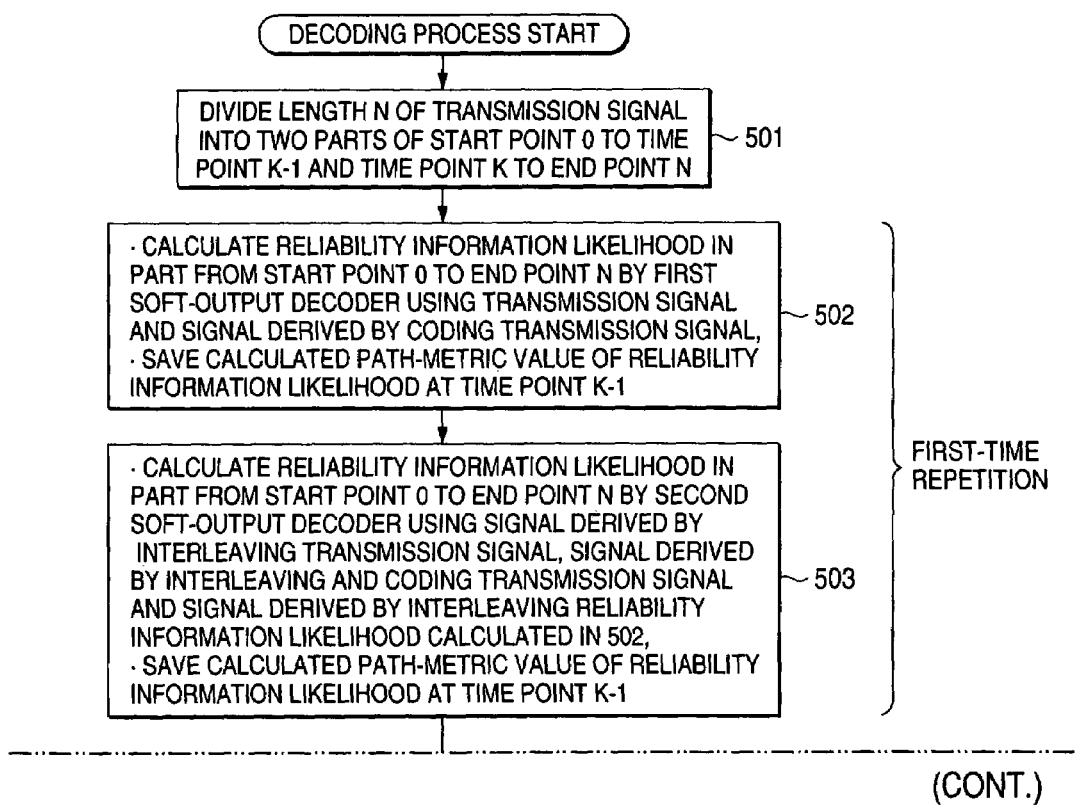
FIG. 5 is a flowchart showing a decoding process of the turbo decoding device according to the embodiment 2 of the present invention.

FIG. 4 is a block diagram showing a configuration of a turbo decoding device according to an embodiment 2 of the present invention. FIG. 5 is a flowchart showing a decoding process of the turbo decoding device according to the embodiment 2 of the present invention.

In FIG. 4, the same reference numerals are affixed to the same constituent elements as those in FIG. 1 and their explanation will be omitted herein. In the present embodiment, a second memory device 110 into/from which the first and second soft-output decoders can write/read a path-metric value is added to the configuration in the embodiment 1.

In the decoding process shown in a flowchart in FIG. 5, steps 501 to 507 correspond to steps 201 to 207 in the embodiment 1 respectively, and also a process of saving the path-metric value at the time point K−1 in the second memory device 110 is added to respective mode processes of the iterative operations in the embodiment 1 in steps 502/503/504/506. In the subsequent iterative decoding process, the saved path-metric value is used as the initial value of the forward probability calculation from the time point K in steps 505/507.

Since the similar operation to the embodiment 1 is carried out by using the turbo decoding device of the present embodiment, a processing time required for the iterative decoding process for the second time et seq. can be reduced by half. Also, since the path-metric value saved in the second memory device is used in the subsequent iterative decoding process, an improvement in an error correcting capability of the decoding operation from the time point K can be achieved.

Embodiment 3

Figure 6:
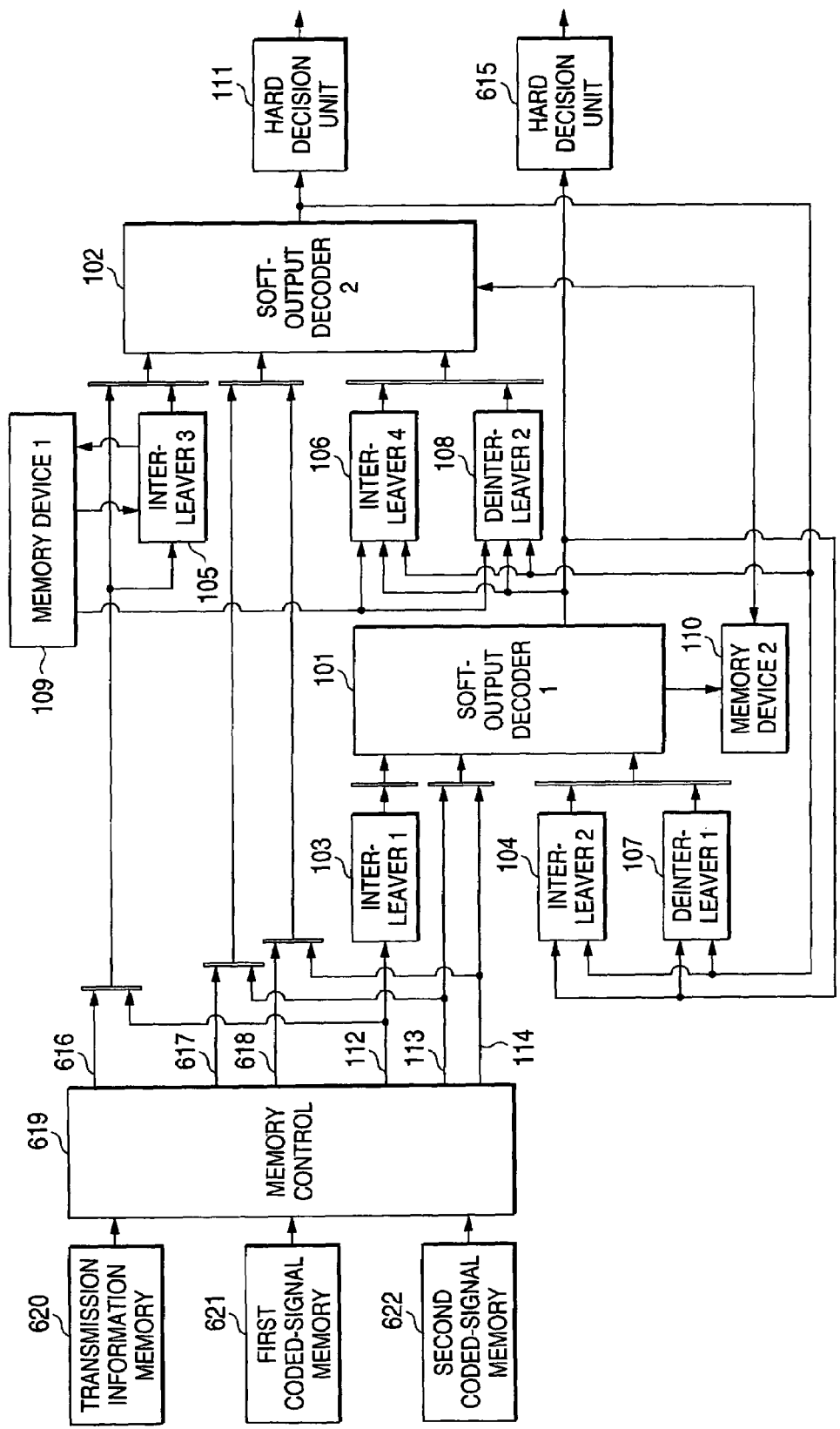
FIG. 6 is a block diagram showing a configuration of a turbo decoding device according to an embodiment 3 of the present invention.
Figure 7:
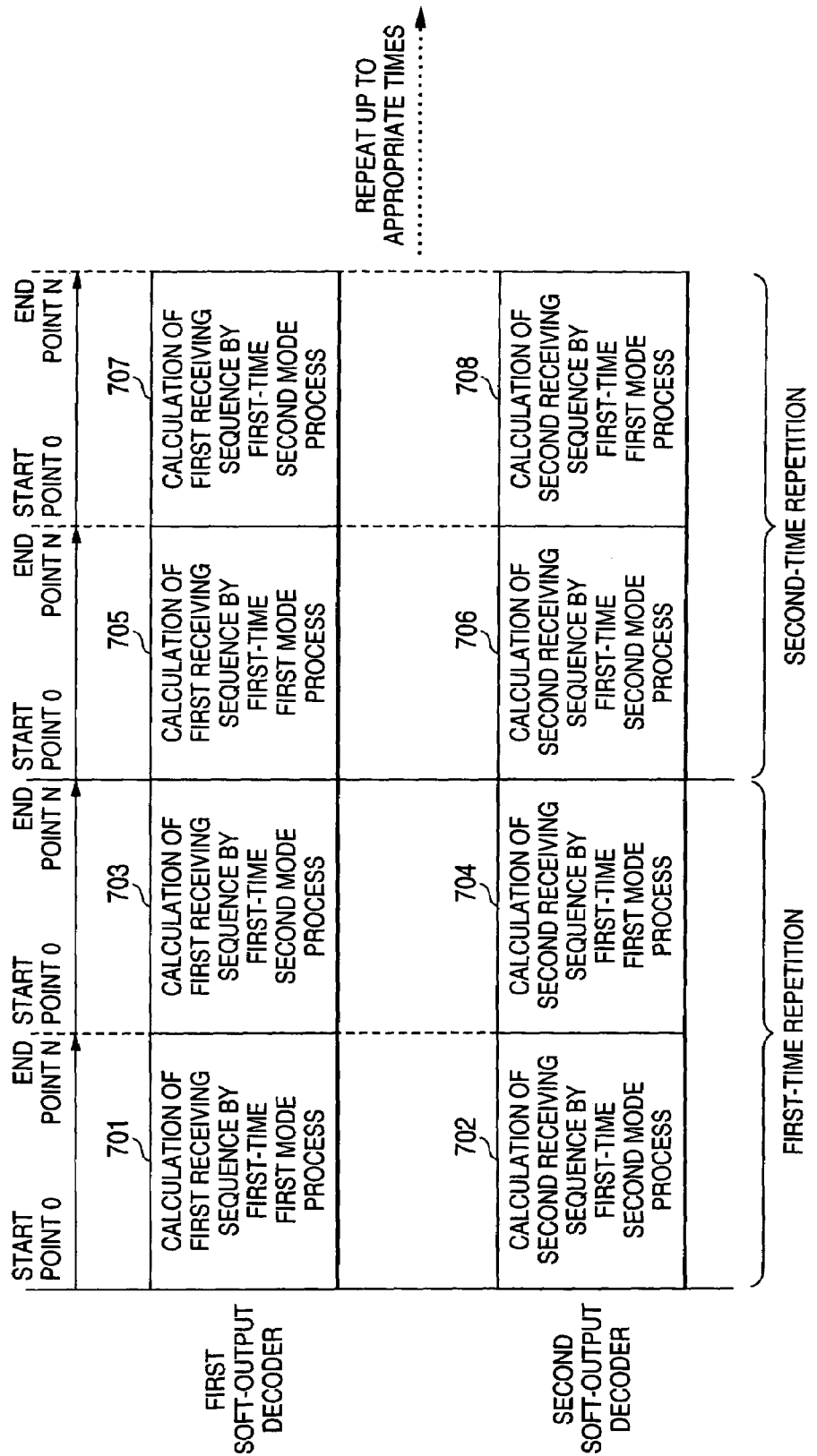
FIG. 7 is a timing chart showing operations of soft-output decoders in the turbo decoding device according to the embodiment 3 of the present invention.

FIG. 6 is a block diagram showing a configuration of a turbo decoding device according to an embodiment 3 of the present invention. FIG. 7 is a timing chart showing operations of first and second soft-output decoders in the turbo decoding device according to the embodiment 3 of the present invention.

In FIG. 6, the same reference numerals are affixed to the same constituent elements as those in FIG. 4 and their explanation will be omitted herein. In the present embodiment, a selecting function of supplying a second receiving sequence having transmission information 616 of a length N, a first coded signal 617 derived by coding the transmission information, and a second coded signal 618 derived by interleaving and coding the transmission information to the second soft-output decoder 102 is added to the configuration in the embodiment 2. Here, the second receiving sequence has no dependency on the first receiving sequence of 112, 113, 114. In addition, a hard decision unit 615, a transmission information memory 620, a first coded-signal memory 621, a second coded-signal memory 622, and a memory control block 619 are added to configuration in the embodiment 2.

In the turbo decoding device constructed in this manner, an operation of decoding-processing simultaneously two receiving sequences will be explained hereunder. First, as a first mode process 701 of the first-time iterative decoding process applied to the first receiving sequence, the transmission information 112 and the first coded signal 113 are supplied to the first soft-output decoder 101 to calculate the reliability information likelihood of a length N.

At the same time, as a second mode process 702 of s the first-time iterative decoding process applied to the second receiving sequence, a signal derived by interleaving the transmission information 616 by virtue of the third interleaver 105 and the second coded signal 618 are supplied to the second soft-output decoder 102 to calculate the reliability information likelihood of a length N.

Then, as a second mode process 703 of the first-time iterative decoding process applied to the first receiving sequence, a signal derived by interleaving the transmission information 112 by means of the first interleaver 103, the second coded signal 114, and a signal derived by interleaving the reliability information likelihood calculated in the first mode process 701 by means of the second interleaver 104 are supplied to the first soft-output decoder 101 as a priori information likelihood to calculate the reliability information likelihood of a length N. Also, a hard decision of the reliability information likelihood is made by the hard decision unit 615. Thus, the first-time decoded result of the first receiving sequence is output.

At the same time, as a first mode process 704 of the first-time iterative decoding process applied to the second receiving sequence, the transmission information 616, the first coded signal 617, and a signal derived by deinterleaving the reliability information likelihood calculated in the second mode process 702 by means of the second deinterleaver 108 are supplied to the second soft-output decoder 102 to calculate the reliability information likelihood of a length N. Also, a hard decision of the reliability information likelihood is made by the hard decision unit 111. Thus, the first-time decoded result of the second receiving sequence is output.

Then, as a first mode process 705 of the second-time iterative decoding process applied to the first receiving sequence, the transmission information 112, the first coded signal 113, and a signal derived by deinterleaving the reliability information likelihood calculated in the preceding second mode process 703 by means of the second deinterleaver 108 are supplied to the first soft-output decoder 101 to calculate the reliability information likelihood of a length N.

At the same time, as a second mode process 706 of the second-time iterative decoding process applied to the second receiving sequence, a signal derived by interleaving the transmission information 616 by means of the third interleaver 105, the second coded signal 618, and a signal derived by interleaving the reliability information likelihood calculated in the preceding first mode process 704 by means of the fourth interleaver 106 are supplied to the second soft-output decoder 102 to calculate the reliability information likelihood of a length N.

Then, as a second mode process 707 of the second-time iterative decoding process applied to the first receiving sequence, a signal derived by interleaving the transmission information 112 by virtue of the first interleaver 103, the second coded signal 114, and a signal derived by interleaving the reliability information likelihood calculated in the first mode process 705 by virtue of the second interleaver 104 are supplied to the first soft-output decoder 101 as a priori information likelihood to calculate the reliability information likelihood of a length N. Also, a hard decision of the reliability information likelihood is made by the hard decision unit 615. Thus, the second-time decoded result of the first receiving sequence is output.

At the same time, as a first mode process 708 of the second-time iterative decoding process applied to the second receiving sequence, the transmission information 616, the first coded signal 617, and a signal derived by deinterleaving the reliability information likelihood calculated in the second mode process 706 by virtue of the second deinterleaver 108 are supplied to the second soft-output decoder 102 to calculate the reliability information likelihood of a length N. Also, a hard decision of the reliability information likelihood is made by the hard decision unit 111. Thus, the second-time decoded result of the second receiving sequence is output.

Subsequently, the decoding process similar to the second-time iterative decoding is executed up to the appropriate repetition times. As explained above, since the above operation is carried out by using the turbo decoding device of the present embodiment, not only a processing time required for the iterative decoding process for the second time et seq. can be reduced by half when one receiving sequence is decoded, but also a processing time can be reduced by half when two receiving sequences are decoded.

Also, since the second soft-output decoder is operated exclusively to execute the second mode process during when the first soft-output decoder executes the first mode process, the concurrent access to the first coded-signal memory 621 and the second coded-signal memory 622 can be avoided. Therefore, these memories can be constructed by a single-port memory.

Embodiment 4

Figure 8:
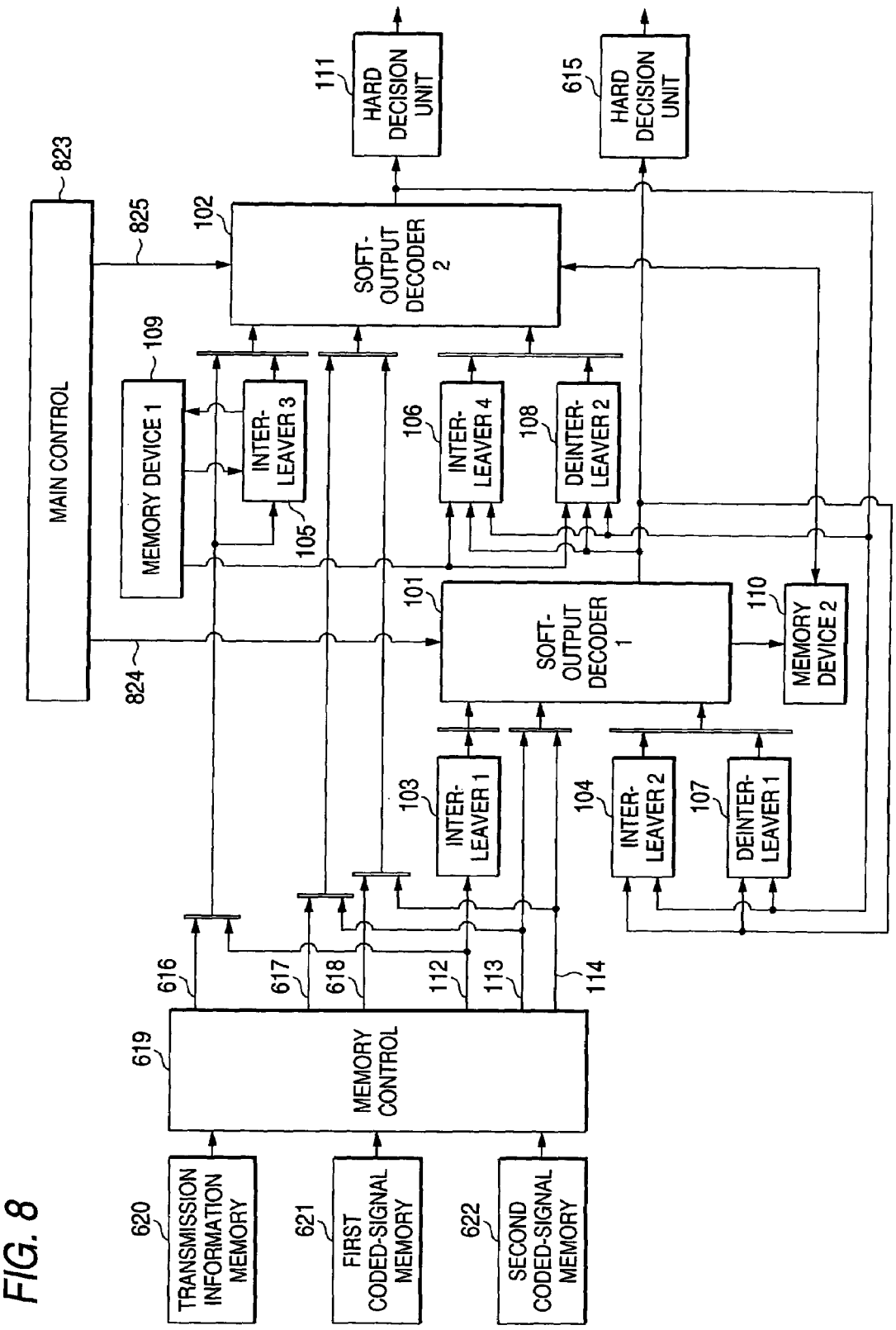
FIG. 8 is a block diagram showing a configuration of a turbo decoding device according to an embodiment 4 of the present invention.
Figure 9:
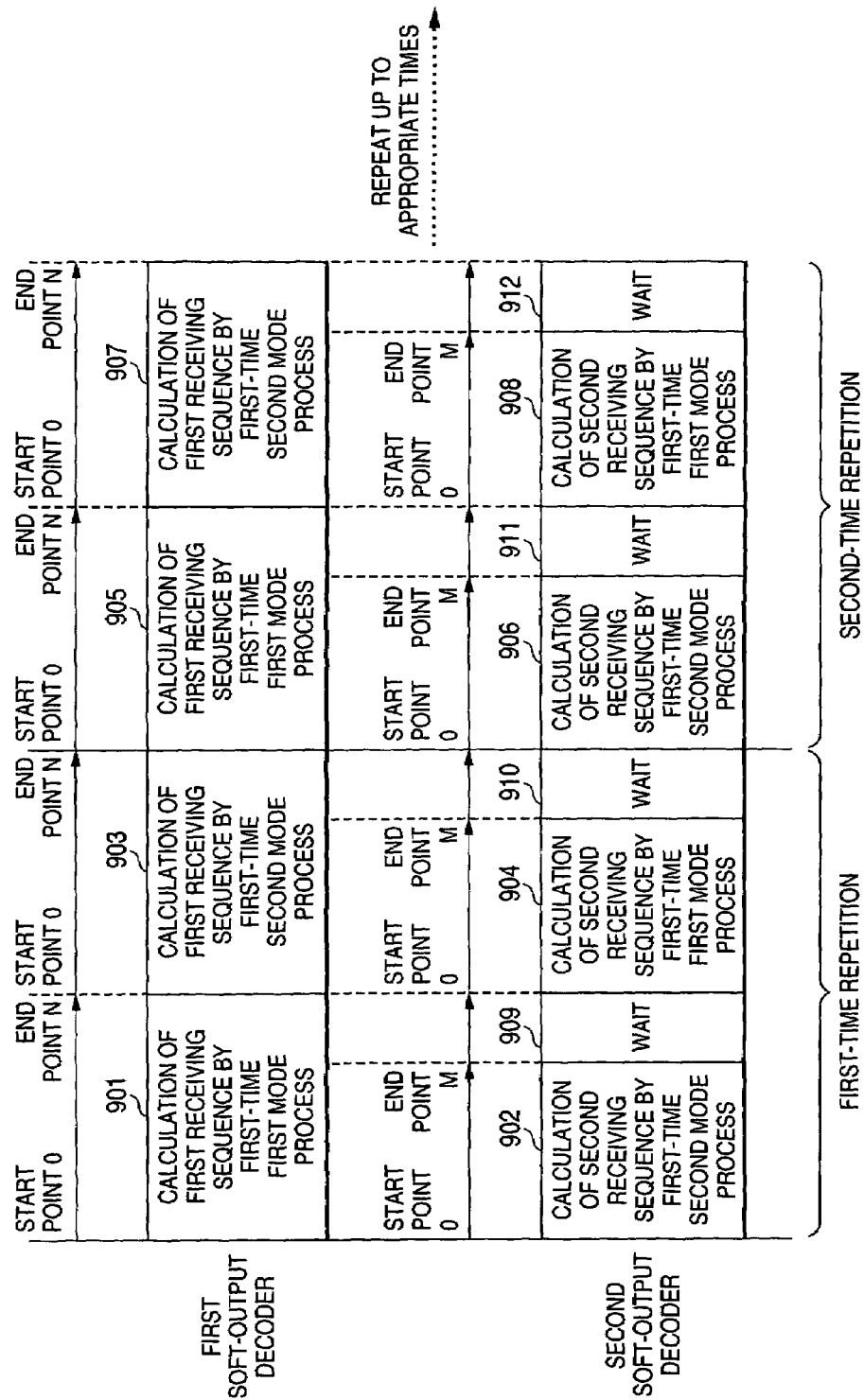
FIG. 9 is a timing chart showing operations of soft-output decoders in the turbo decoding device according to the embodiment 4 of the present invention.
Figure 10:
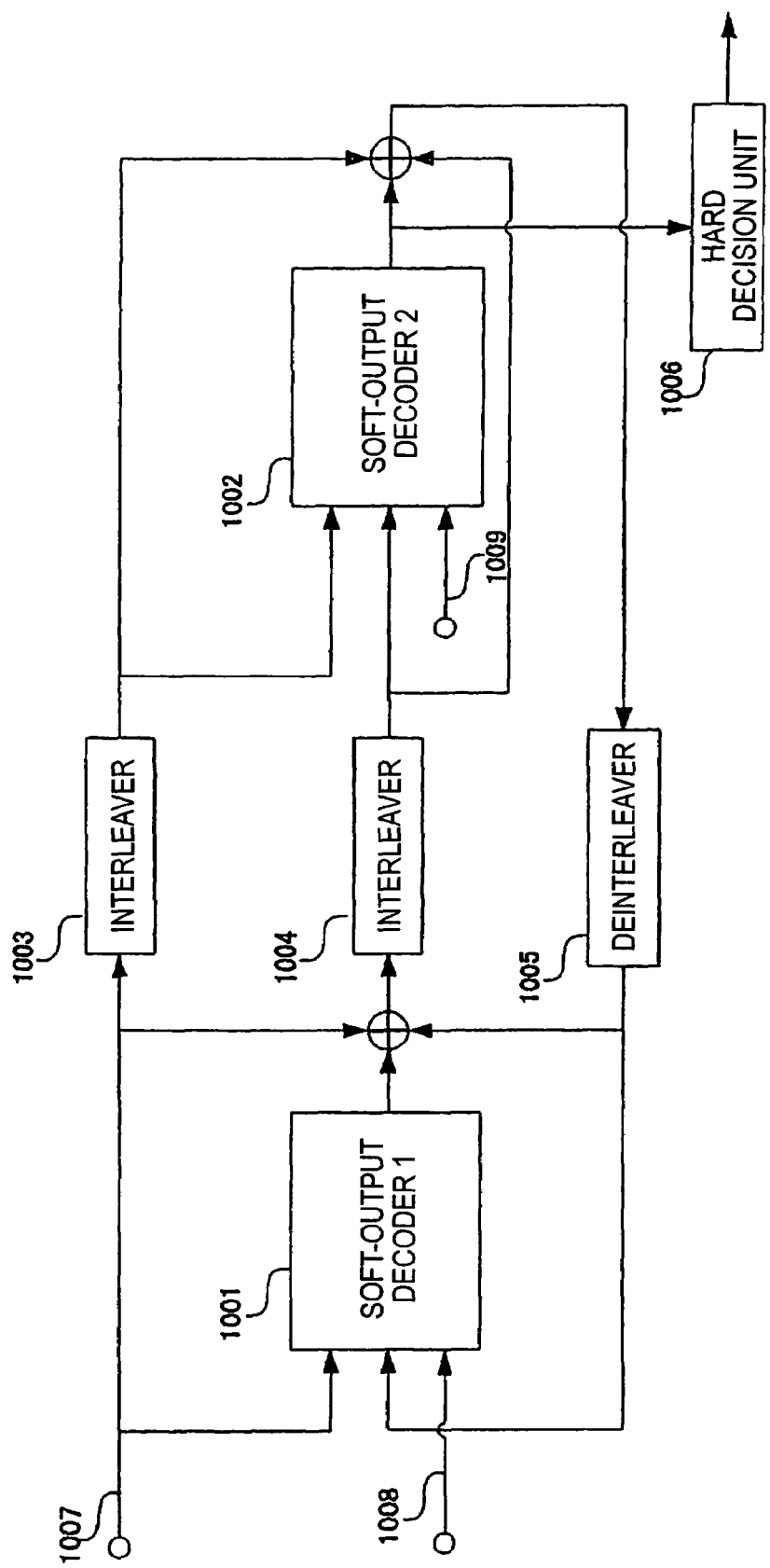
FIG. 10 is a block diagram showing a configuration of a turbo decoding device in the prior art.

FIG. 8 is a block diagram showing a configuration of a turbo decoding device according to an embodiment 4 of the present invention. FIG. 9 is a timing chart showing operations of first and second soft-output decoders in the turbo decoding device according to the embodiment 4 of the present invention.

In FIG. 8, the same reference numerals are affixed to the same constituent elements as those in FIG. 6 and their explanation will be omitted herein. In the present embodiment, a main control block 823 for executing wait controls 824/825 applied to the first and second soft-output decoders respectively is added to the configuration of the embodiment 3.

Also, in a timing chart in FIG. 9, mode processes 901 to 908 correspond to the mode processes 701 to 708 in the embodiment 3 in same order, and waiting processes 909 to 912 are inserted into respective mode processes of the iterative operations in the embodiment 3.

Even in the case that lengths of the first receiving sequence and the second receiving sequence are different, if the same operations as the embodiment 3 are carried out by using the turbo decoding device of the present embodiment, the process in the other soft-output decoder can be brought into the wait state in the waiting processes 909/910/911/912 after any one of respective mode processes 902/904/906/908 is ended.

In this manner, even in the case that the lengths of the first receiving sequence and the second receiving sequence are different, the decoding process can be carried out while keeping the advantage of the embodiment 3 by adding the wait control to the turbo decoding device.

According to the present invention, since operations of two circuits constructed to have the same configuration that consists of the soft-output decoder, two interleavers and one deinterleaver are controlled, two soft-output decoders can be concurrently operated in the iterative decoding process for the second time et seq. in the iterative decoding process of the turbo codes. Therefore, a processing time required for the decoding process for the second time et seq. can be halved.

Also, according to the present invention, the path-metric value calculated at the time of preceding decoding in the iterative decoding process is saved, and then this value is used as the initial value of the forward probability calculation in the subsequent iterative decoding process. Therefore, an improvement in an error correcting capability of the decoding operation from a certain time point can be achieved.

In addition, according to the present invention, since the decoding process of two receiving sequences can be carried out in parallel by two soft-output decoders, a processing time can be halved when two receiving sequences are decoded. At that time, even in the case that lengths of two receiving sequences are different, since the process of the other soft-output decoder is brought into the wait state after the process of any one soft-output decoder is ended, the decoding process of two receiving sequences can be carried out in parallel by two soft-output decoders and thus a decoding processing time can be halved.

What is claimed is:

1. A turbo decoding device for executing a soft-input/soft-output decoding by using a receiving sequence having transmission information, a first coded signal derived by coding the transmission information, and a second coded signal derived by interleaving and coding the transmission information, said turbo decoding device comprising:
   a first soft-output decoder for outputting a first reliability information likelihood;
   a second soft-output decoder for outputting a second reliability information likelihood;
   a first interleaver for interleaving the transmission information to supply to the first soft-output decoder;
   a second interleaver for interleaving the first reliability information likelihood or the second reliability information likelihood to supply to the first soft-output decoder;
   a first deinterleaver for deinterleaving the first reliability information likelihood or the second reliability information likelihood to supply to the first soft-output decoder;
   a third interleaver for interleaving the transmission information to supply to the second soft-output decoder;
   a fourth interleaver for interleaving the first reliability information likelihood or the second reliability information likelihood to supply to the second soft-output decoder; and
   a second deinterleaver for deinterleaving the first reliability information likelihood or the second reliability information likelihood to supply to the second soft-output decoder.

2. The turbo decoding device according to claim 1, further comprising:
   means for saving a path-metric value calculated by the first soft-output decoder at a certain time point when the receiving sequence in which the transmission information of a length N is coded is decoded by an iterative process; and controlling means for using the path-metric value in a subsequent iterative process as an initial value of a forward probability calculation in the second soft-output decoder.

3. The turbo decoding device according to claim 2, further comprising:

means for saving an internal state of the third interleaver at any time point in a first-time decoding process when a receiving sequence in which the transmission information of a length N is coded is decoded by an iterative process; and controlling means for using the internal state in a decoding process for a second time et seq. as initial values of the third interleaver, the fourth interleaver, and the second deinterleaver.

4. The turbo decoding device according to claim 3, wherein, in an iterative decoding process for a second time et seq. using the transmission information of a length N, the first coded signal derived by coding the transmission information, and the first reliability information likelihood or the second reliability information likelihood calculated in a preceding iterative decoding process, a decoding process from a start point 0 to a time point K−1 is executed by the first soft-output decoder and a decoding process from a time point K to an end point N is executed by the second soft-output decoder.

5. The turbo decoding device according to claim 3, wherein, in the iterative decoding process for a second time et seq. using a signal derived by interleaving the transmission information of a length N, the second coded signal derived by interleaving and coding the transmission information, and the first reliability information likelihood or the second reliability information likelihood, a decoding operation process from an interleave start point 0 to an interleave time point K−1 is executed by the first soft-output decoder and a decoding operation from an interleave time point K to an interleave end point N is executed by the second soft-output decoder.

6. The turbo decoding device according to claim 1, further comprising:

means for saving an internal state of the third interleaver at any time point in a first-time decoding process when a receiving sequence in which the transmission information of a length N is coded is decoded by an iterative process; and controlling means for using the internal state in a decoding process for a second time et seq. as initial values of the third interleaver, the fourth interleaver, and the second deinterleaver.

7. The turbo decoding device according to claim 6, wherein, in an iterative decoding process for a second time et seq. using the transmission information of a length N, the first coded signal derived by coding the transmission information, and the first reliability information likelihood or the second reliability information likelihood calculated in a preceding iterative decoding process, a decoding process from a start point 0 to a time point K−1 is executed by the first soft-output decoder and a decoding process from a time point K to an end point N is executed by the second soft-output decoder.

8. The turbo decoding device according to claim 6, wherein, in the iterative decoding process for a second time et seq. using a signal derived by interleaving the transmission information of a length N, the second coded signal derived by interleaving and coding the transmission information, and the first reliability information likelihood or the second reliability information likelihood, a decoding operation process from an interleave start point 0 to an interleave time point K−1 is executed by the first soft-output decoder and a decoding operation from an interleave time point K to an interleave end point N is executed by the second soft-output decoder.

9. The turbo decoding device according to any one of claim 1 to 5, wherein a soft-input/soft-output decoding of a first receiving sequence having the transmission information of a length N, the first coded signal derived by coding the transmission information, and the second coded signal derived by interleaving and coding the transmission information is executed by the first soft-output decoder, and wherein a soft-input/soft-output decoding of a second receiving sequence having the transmission information of a length M, the first coded signal derived by coding the transmission information, and the second coded signal derived by interleaving and coding the transmission information, which has no mutual dependency on the first receiving sequence, is executed by the second soft-output decoder.

10. The turbo decoding device according to claim 9, wherein, when the reliability information likelihood is calculated by using the transmission information and the first coded signal out of the first receiving sequence in the first soft-output decoder, the reliability information likelihood is calculated by using the signal derived by interleaving the transmission information and the second coded signal out of the second receiving sequence in the second soft-output decoder during.

11. The turbo decoding device according to claim 10, wherein, when lengths of the transmission information are not equal in a first-time iterative decoding process in the first receiving sequence and the second receiving sequence, one soft-output decoder, which ends earlier a calculation of the reliability information likelihood, out of the first soft-output decoder and the second soft-output decoder is brought into a wait state until other soft-output decoder ends the calculation of the reliability information likelihood.

12. A communication terminal device into which the turbo decoding device set forth in any one of claim 1 to claim 11 is incorporated.

13. A readable machine medium or hardware having a program product incorporated or embedded therein, said a program product executable by a processor for causing the processor to operate the turbo decoding device set forth in any one of claim 1 to claim 11.

* * * * *